(12) United States Patent
Kuzmenka

(10) Patent No.: US 7,808,843 B2
(45) Date of Patent: Oct. 5, 2010

(54) INTEGRATED CIRCUIT AND METHOD OF OPERATING THE SAME

(75) Inventor: Maksim Kuzmenka, Munich (DE)

(73) Assignee: Qimonda AG, Munich (DE)

( * ) Notice: Subject to any disclaimer, the term of this patent is extended or adjusted under 35 U.S.C. 154(b) by 568 days.

(21) Appl. No.: 11/839,262

(22) Filed: Aug. 15, 2007

(65) Prior Publication Data

US 2009/0045679 A1 Feb. 19, 2009

(51) Int. Cl.
*G11C 5/14* (2006.01)
*G05F 1/607* (2006.01)

(52) U.S. Cl. ......... 365/189.09; 327/337; 327/538; 365/189.06; 365/206

(58) Field of Classification Search ......... 365/189.06, 365/189.09, 206; 327/337, 538
See application file for complete search history.

(56) References Cited

U.S. PATENT DOCUMENTS 4,849,661 A * 7/1989 Bazes .................. 326/71
5,689,460 A * 11/1997 Ooishi ............... 365/189.07
6,788,579 B2 * 9/2004 Gregori et al. ...... 365/185.19

* cited by examiner

*Primary Examiner*—Hoai V Ho
*Assistant Examiner*—Jay Radke
(74) *Attorney, Agent, or Firm*—Edell, Shapiro & Finnan, LLC

(57) ABSTRACT

An integrated circuit includes a storage component, a voltage stabilizer circuit with an input configured to receive an input voltage and an output configured to provide an output voltage, and a load. The load is coupled to the output of the voltage stabilizer circuit. The integrated circuit is operable in a first and second operating state. In the first operating state, the storage component receives an input voltage and in the second operating state the input voltage is provided to the input of the voltage stabilizer circuit.

29 Claims, 6 Drawing Sheets

INTEGRATED CIRCUIT AND METHOD OF OPERATING THE SAME

BACKGROUND

In a semiconductor chip, especially in a digital chip (e.g., a processor chip, a controller chip and a memory chip), more than one supply voltage is used. A high supply voltage is used for the periphery as well as for input/output components of the chips. A lower supply voltage is used for the processor or memory core supply. A core voltage having a low level allows for the use of faster thin oxide transistors, to filter some of the supply noise, and to reduce power consumption.

A chip of an integrated circuit (e.g., a semiconductor memory) comprises voltage supply pads from which the supply voltage is distributed to several areas of the chip by a power distribution network. Especially for high current consuming parts situated far away from the supply pads, undesired voltage drops may occur over the power distribution network.

If a ground connection of the power distribution network is implemented with very low resistivity, the ground level will be approximately the same over the entire power distribution network of the chip, and voltage generators spread over the chip area are providing the same local voltage levels. However, for relatively high-resistive ground connections a respective output current of a respective voltage stabilizer or its neighbors could produce a significant voltage drop on local ground nodes.

In a power distribution network voltage drops could be easily in a range of 50 millivolts (mV) in the case where external supply voltages Vext are provided in a range of, for example, 1.5 V. If the level of a control voltage for controlling a respective voltage stabilizer is not corrected with respect to any local ground, the output voltage generated by each of the local voltage stabilizers will be lower by up to 50 mV correspondingly.

Furthermore, a load current generated at an output terminal of a voltage stabilizer could change very fast between its minimum and maximum values. Therefore, in a power distribution network a load current may change in a range of 0 ... 25 mA per each voltage stabilizer. For modern DRAM chips the number of such voltage stabilizers could be in range of 50 and overall core current consumption could be in range of 1 A.

In a power distribution network a first load voltage may be measured with a dynamical change between 1.3 V ... 1.263 V. A second load voltage may be measured with a dynamical change range between 1.3 V ... 1.25 V, and a far-end load voltage may be measured with a dynamical change in between 1.3 V ... 1.225 V because of uncompensated ground drops.

SUMMARY

Described herein is an integrated circuit including: a storage component, a voltage stabilizer circuit with an input configured to receive an input voltage and an output to provide an output voltage, and a load. The load is coupled to the output of the voltage stabilizer circuit. The integrated circuit is operable in a first and second operating state. In the first operating state, the storage component receives an input voltage and in the second operating state the input voltage is provided to the input of the voltage stabilizer circuit.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The integrated circuit is explained in more detail below with reference to accompanying drawings, where.

DETAILED DESCRIPTION

Figure 1:
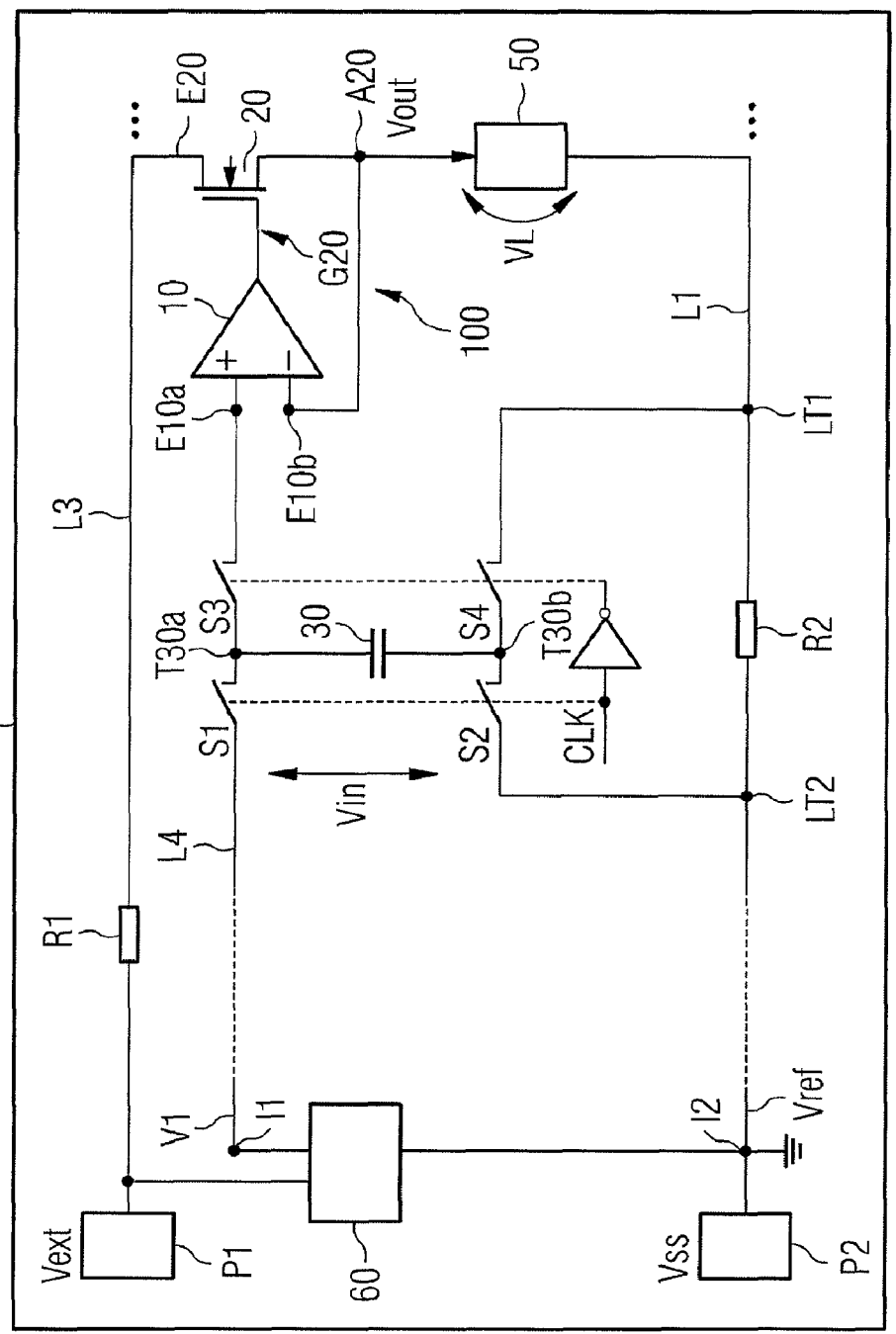
FIG. 1 shows an embodiment of an integrated circuit to generate an output voltage.

An integrated circuit is described herein which includes a storage component, a voltage stabilizer circuit with an input configured to receive an input voltage and an output to provide an output voltage, and a load. The integrated circuit and a method of operating the same are explained in more detail below with reference to accompanying drawings, where:

FIG. 1 illustrates an embodiment of an integrated circuit comprising a voltage stabilizer 100 to generate an output voltage Vout. An external voltage Vext which may be a supply voltage is applied to a pad P1. The pad P1 is connected to a voltage generator 60 which is, for example, a band-gap reference circuit. The band-gap reference circuit 60 is connected to an input terminal I2 which is connected to a pad P2 to receive an input voltage Vss and a ground potential. Input voltage Vss may be a negative supply voltage, whereas a positive supply voltage Vext is provided at pad P1.

According to an embodiment of the integrated circuit, the voltage stabilizer 100 comprises an input terminal I1 to receive an input voltage V1. The input terminal I1 of the integrated circuit is connected to an output side of the voltage generator 60. A terminal T30a of a capacitor 30 is connectable via a switch S1 to the input terminal I1 via a track L4 and is connectable via another switch S3 to an input terminal E10a of an operational amplifier 10. A terminal T30b of capacitor 30 is connectable via a switch S2 to a node LT2 of a track L1. Track L1 is connected to input terminal I2 of the integrated circuit. Terminal T30b of capacitor 30 is connected via a switch S4 to a node LT1 of track L1. A section of track L1 between nodes LT1 and LT2 has a resistance R. Switches S1 ... S4 are controlled by a control signal CLK.

An output side of operational amplifier 10 is connected to a control terminal G20 of a controllable resistor 20. Controllable resistor 20 may be configured as a transistor comprising an input terminal E20 to receive the supply voltage Vext and an output terminal A20 to provide the output voltage Vout. Input terminal E20 is connected via a track L3 having a resistance R1 to pad P1. Output terminal A20 is connected to an input terminal E10b of operational amplifier 10. Operational amplifier 10 and transistor 20 form an operational amplifier based follower with output current booster. A load 50 is connected between output terminal A20 and node LT1 wherein a voltage drop VL occurs over load 50 when the output voltage Vout is generated.

In order to generate the output voltage Vout, in a first operation mode, the pair of switches S1 and S2 is turned on and the pair of switches S3 and S4 is turned off such that capacitor 30 is charged to a voltage Vin. The voltage Vin may reach the level of the input voltage V1 delivered by the voltage generator 60. In a second operation mode the pair of switches S1 and S2 is turned off and the pair of switches S3 and S4 is turned on. In this operation state, terminal T30a of capacitor 30 is connected to input terminal E10a of operational amplifier 10 and terminal T30b of capacitor 30 is connected to node LT1. During the second operation mode the voltage stabilizer generates output voltage Vout and a voltage drop VL occurs over load 50.

The integrated circuit allows that a voltage drop occurring over the load keeps constant even if a ground potential changes due to for example ground noise. Furthermore, the voltage drop does not depend on temperature/voltage/process variations and on far-end ground shifts.

Figure 2:
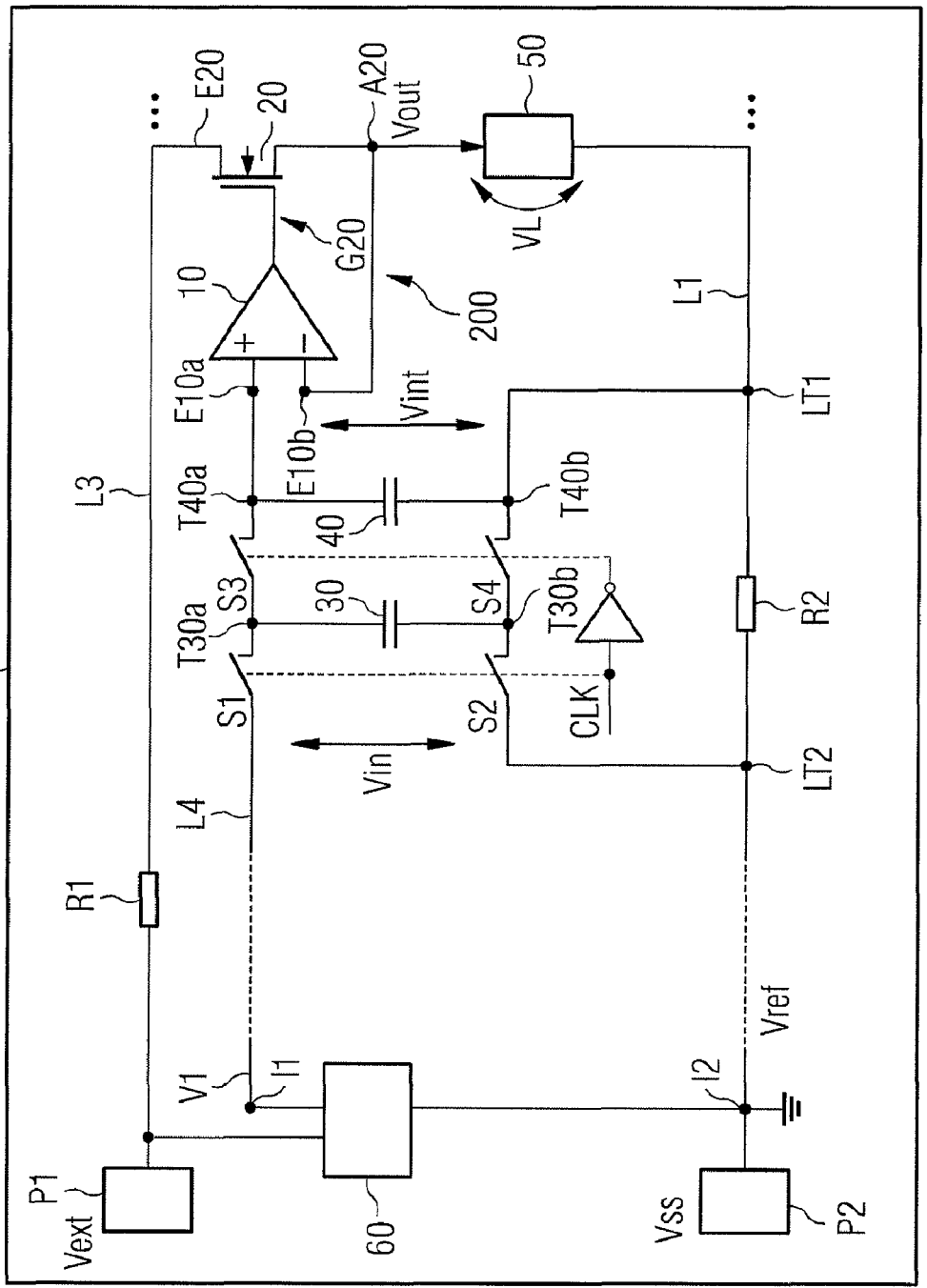
FIG. 2 shows a further embodiment of an integrated circuit to generate an output voltage.

FIG. 2 shows a further embodiment of an integrated circuit comprising a voltage stabilizer 200 to generate an output voltage Vout. The embodiment illustrated in FIG. 2 essentially corresponds to the embodiment of the integrated circuit shown in FIG. 1. In contrast to the embodiment shown in FIG. 1, another capacitor 40 is provided. Capacitor 40 is operated as a load capacitor. A terminal T40a of load capacitor 40 is connected to the input terminal E10a of operational amplifier 10 which is the non-inverting input terminal of operational amplifier 10 and is connectable via switch S3 to terminal T30a of capacitor 30. Terminal T40b of capacitor 40 is connected to node LT1 and is connectable to terminal T30b via switch S4

As well as already described for the embodiment of the integrated circuit shown in FIG. 1, the integrated circuit to generate the output voltage Vout shown in FIG. 2 is operated in a first and a second operation state. In the first operation state, switches S1 and S2 are turned on, whereas switches S3 and S4 are turned off. As a consequence, capacitor 30 which is operated as a flying capacitor is connected to the input terminal I1 to receive the input voltage V1. During the first operation state capacitor 30 charges up to a voltage Vin, for example to the level of the input voltage V1. In the second operation state of the integrated circuit switches S1 and S2 are turned off by actuating with control signal CLK and come in a high resistive state. Then, switches S3 and S4 are turned on such that the flying capacitor 30 is connected to the load capacitor 40 which is charged to a voltage level Vint. After several charge-discharge cycles the level of the voltage Vin and the level of the voltage Vint are equalized.

The embodiment of the integrated circuit according to FIG. 2 comprising capacitor 40 allows a local far-end decoupling of the input voltage V1. Furthermore, the circuit as illustrated in FIG. 2 prevents that capacitor 40 connected to the input terminal E10a of operational amplifier 10 discharges and thereby lose the level of the input voltage, especially when the far-end ground potential varies with certain dynamics.

Due to for example ground noise, a reference potential Vref which corresponds to the ground level of the circuits shown in FIGS. 1 and 2 can change between 0 V and 75 mV. However, the switching capacitor-based technique as shown in the embodiments of FIG. 1 and FIG. 2 allows that the voltage drop VL measured over the load will be constant, even if the ground level changes in a certain range. Furthermore, the voltage error goes nearly to zero and does not depend on temperature/voltage/process variations as well as it is not dependent from the far-end ground shift. Furthermore, the switching capacitor-based technique has no need in large, slow-reacting and current consuming operational amplifiers. One more problem of operational amplifiers realized with fast "logic" technology is relatively large voltage offset and thermal and time dependent drift. The effects are getting drastic because of extremely low supply voltage for analog circuits. The transistors used for the switches can be designed very short.

Figure 3:
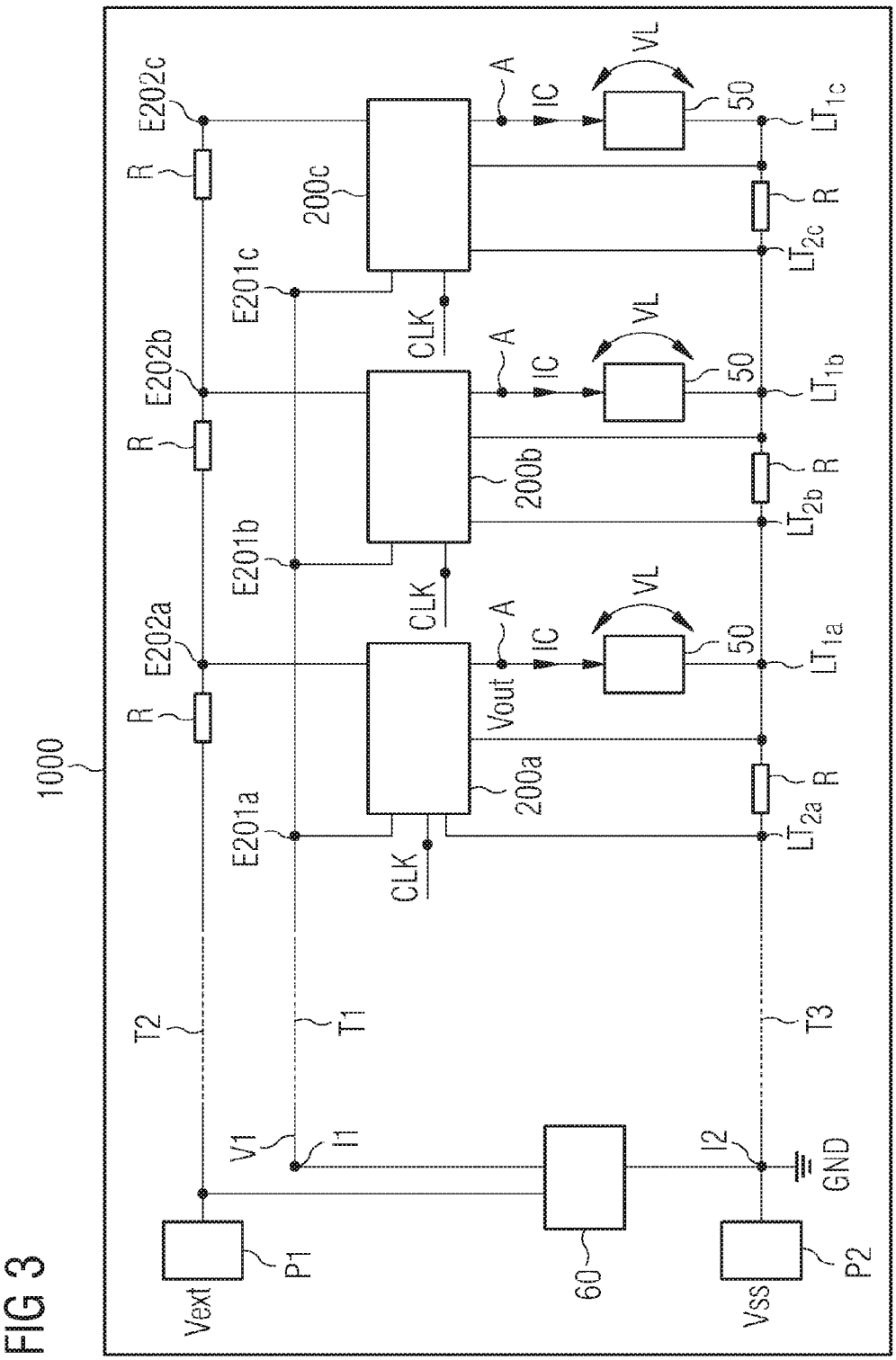
FIG. 3 shows an embodiment of a semiconductor memory chip comprising several voltage stabilizers.

FIG. 3 shows a chip 1000, for example a memory chip, comprising voltage stabilizers 200a, 200b and 200c as shown in the embodiment of FIG. 2 which are distributed over the chip and connected to loads 50. A pad P1 to receive an external voltage Vext, for example a positive external supply voltage, is arranged in a center portion of the chip area. Another pad P2 to receive a second input voltage Vss, for example a negative supply voltage or a ground potential, is also located in the center portion of the chip near pad P1.

A voltage generator 60 is connected between pad P1 and pad P2. The voltage generator generates an input voltage V1 at an output side of the voltage generator which is applied to an input terminal I1 of the power distribution network. Input terminal I1 is connected to a track T1 via which the input voltage V1 is applied to respective input terminals E201a, E201b and E201c of voltage stabilizers 200a, 200b and 200c. The voltage stabilizers are each arranged between a track T2 and a track T3. Track T2 is connected to pad P1 to receive the external supply voltage Vext. Sections of track T2 located between input terminals E202a, E202b and E202c have a resistance R. The input voltage Vext, for example a positive external supply voltage, is applied to respective input terminals E202a, E202b and E202c of each of the voltage stabilizers.

Each of the voltage stabilizers generates a respective output voltage Vout at a respective output terminal A of the voltage stabilizers. Loads 50 are each connected between the respective output terminals A of each of the voltage stabilizers and a respective node LT of track T3. A plurality of terminals LT (e.g., LT1a, LT2a, LT1b, LT2b, LT1c, and LT2c) is distributed along track T3 wherein a respective section between adjacent terminals LT (e.g., LT1a-LT2a, LT1b-LT2b, and LT1c-LT2c) of track T3 has a resistance R. Track T3 is connected to an input terminal I2 which is in connection to the voltage generator 60, as well as in connection to pad P2 to receive the input voltage Vss and a terminal to receive a ground potential GND.

Figure 4:
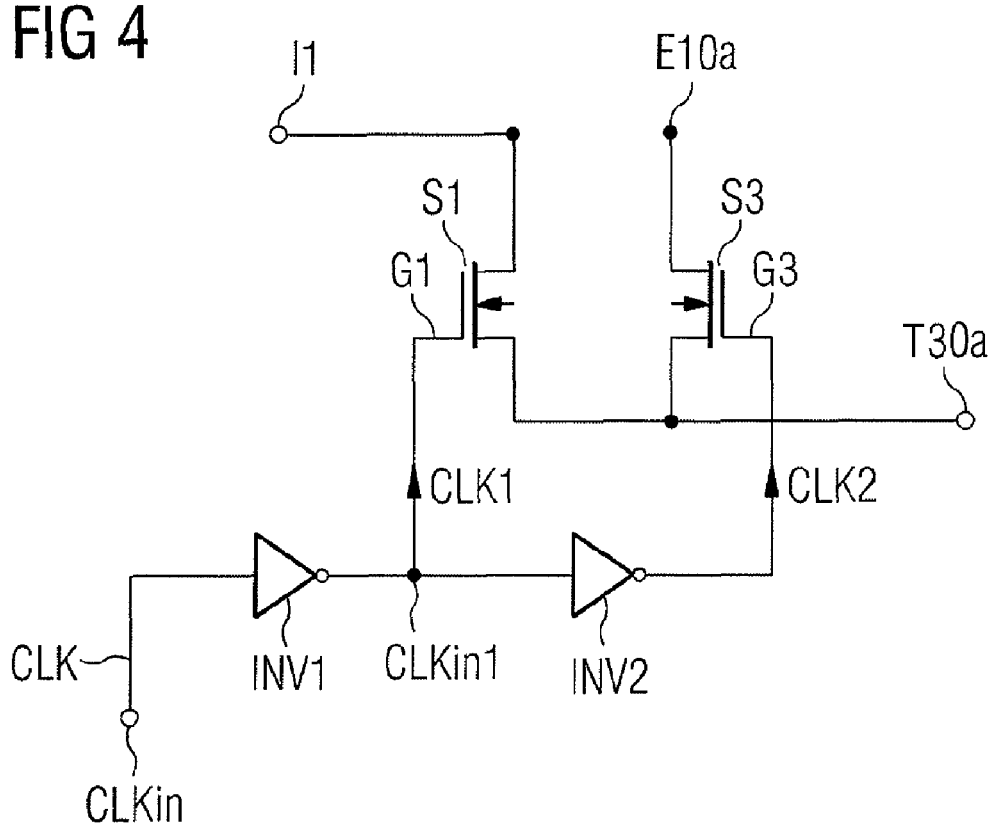
FIG. 4 shows an embodiment of switches for applying a voltage to an operational amplifier of a voltage stabilizer.

FIG. 4 shows an embodiment of a circuit design for the switches S1 and S3 transferring the input voltage V1 to capacitor 30 or capacitor 40. Switches S1 and S3 may be implemented as transistors. FIG. 4 shows the realization of switches S1 and S3 as transistors wherein the switching behavior of the transistors is controlled by clock-shaped control signals CLK1 and CLK2. A control terminal G1 of transistor S1 is actuated by a control signal CLK1 generated at an output node of an inverter INV1. Inverter INV1 derives the control signal CLK1 from a control signal CLK applied to a control signal input terminal CLKin. A control terminal G3 of transistor S3 is driven by a control signal CLK2 which is derived from control signal CLK1 by a delay circuit INV2. Switches S2 and S4 may be implemented in the same way as it is shown in FIG. 4 for the switches S1 and S3.

Figure 5:
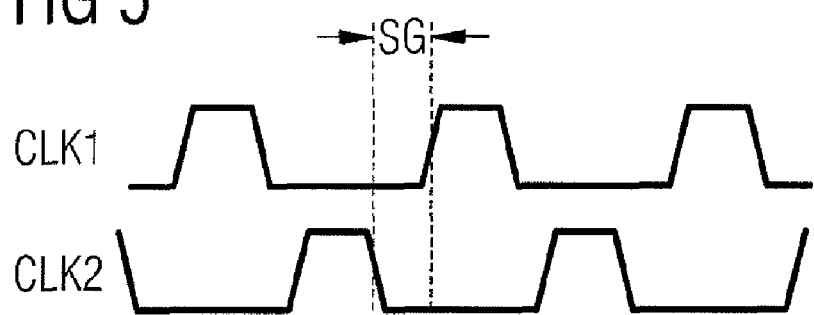
FIG. 5 shows a diagram of different control signals for controlling a switching of the switches.

FIG. 5 shows a timing diagram of the clock-shaped control signals CLK1 and CLK2 having a security gap SG. The pair of switches S1, S2 and S3, S4 are turned on and off with a small time delay caused by the illustrated small security gap SG to prevent leakage.

Figure 6:
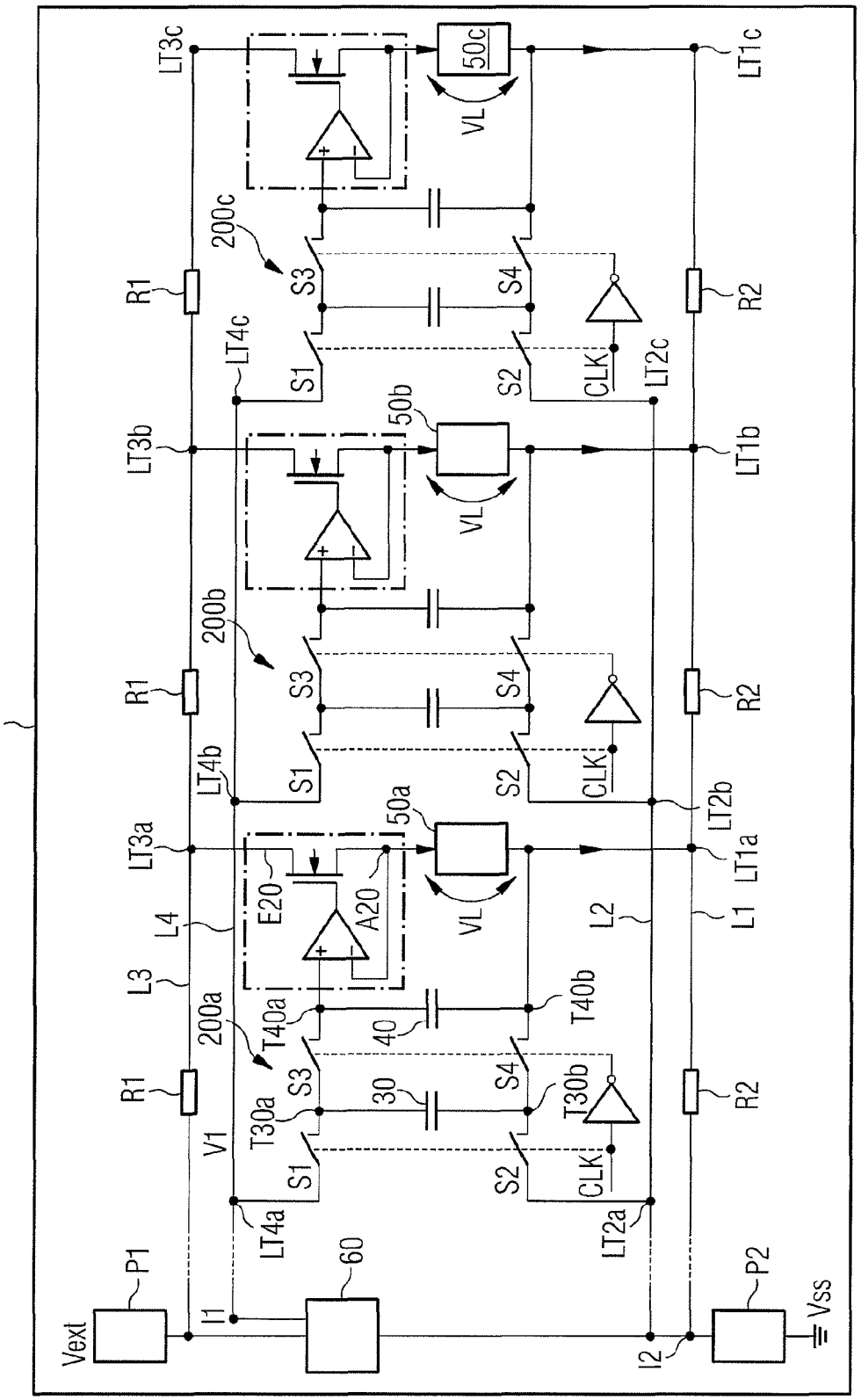
FIG. 6 shows an embodiment of an integrated circuit comprising a plurality of voltage stabilizers to generate respective output voltages.

FIG. 6 shows an embodiment of an integrated circuit wherein several voltage stabilizers 200a, 200b and 200c are distributed over a chip area 1000. The voltage stabilizers are designed as shown in the embodiment of FIG. 3. An external voltage Vext is applied to a pad P1 and transferred via track L3 comprising sections with a resistance R1 between nodes LT3a, LT3b and LT3c. Nodes LT3a, LT3b and LT3c are connected to the respective input terminals E20 of the voltage stabilizers 200a, 200b and 200c. The external voltage Vext which may be a positive supply voltage is further transferred to voltage generator 60 which is additionally connected to a pad P2 to receive the voltage Vss. Voltage generator 60 which may be a band-gap reference circuit generates an input voltage V1 at input terminal I1. Input voltage V1 is transferred to each of the voltage stabilizers via nodes LT4a, LT4b and LT4c of track L4 which are connected to respective switches S1 and S3.

Input terminal I2 is connected to a track L2 by which input voltage Vss is applied to the respective switches S2 and S4 via nodes LT2a, LT2b and LT2c. Furthermore, input terminal I2 is connected to a track L1 comprising several sections wherein a section is located between adjacent nodes LT1a, LT1b and LT1c. Each section of track L1 has a resistance of R2. A respective output terminal A20 of each of the voltage stabilizers is connected via a respective load 50a, 50b and 50c to respective terminals LT1a, LT1b and LT1c of a track L1

In contrast to the embodiment shown in FIG. 3 the voltage stabilizers shown in FIG. 6 do not share one ground track. As a consequence, the resulting voltage mismatch is improved. In the system shown in FIG. 6, in addition to the input voltage V1, the local band-gap ground needs to be distributed to each voltage stabilizer. Due to the fact that there is no static current flowing through the tracks for transferring the input voltage V1 and the band-gap ground, there will be no need to use wide traces. Due to the fact, that the reference voltage is usually defined once, for example by metal options or pre-initialization, and does not change later, during normal operation, reference voltage transfer does not need to be fast. Time constant of few microseconds or even milliseconds will be enough. The integrated circuit allows that even if the ground level changes between a range of certain millivolts, for example if the ground level changes in a range of 0, . . . , 75 mV, the voltage drop VL over the load will keep constant. A stable voltage is required because the delay of digital signals is dependent on the power supply.

Figure 7:
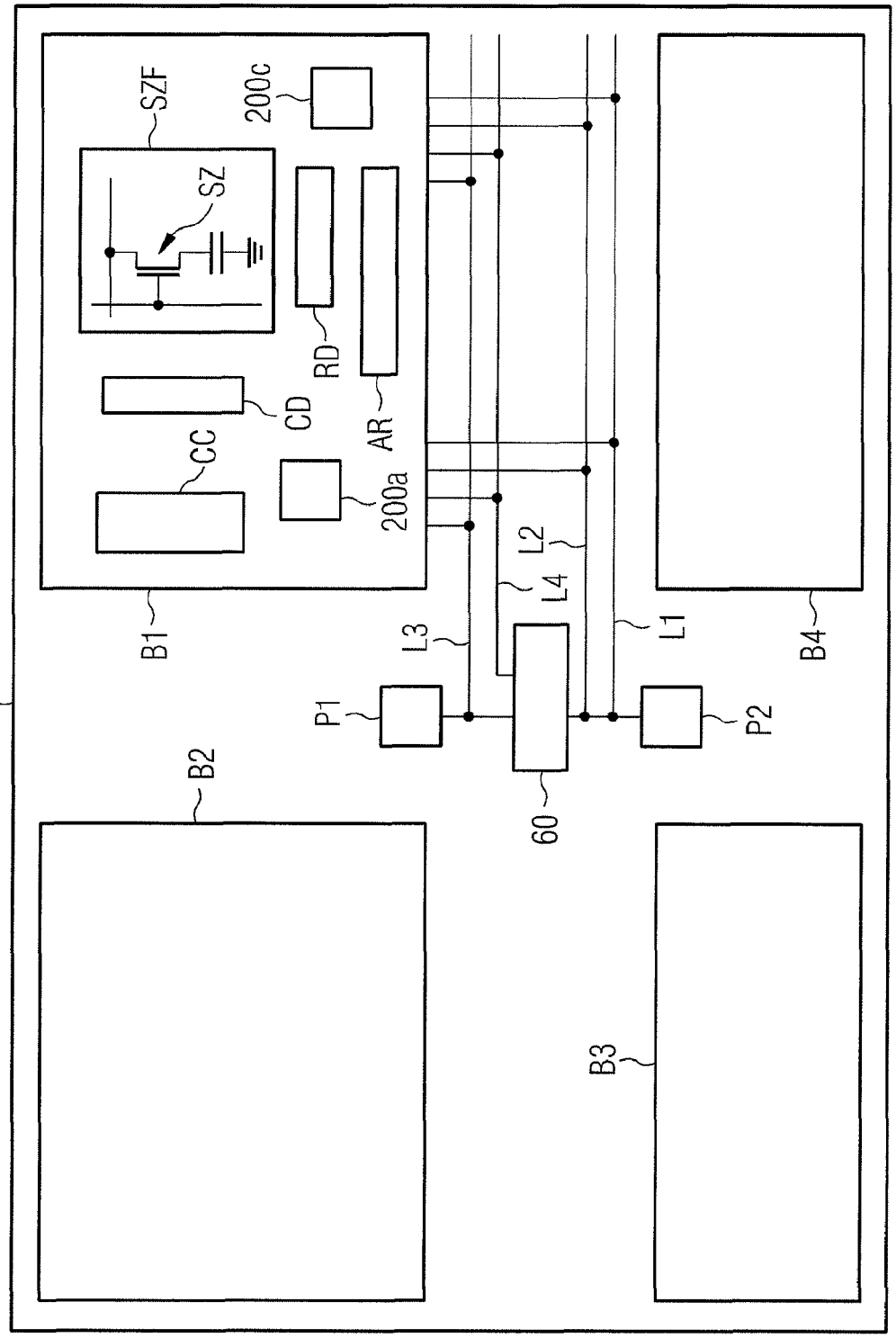
FIG. 7 shows an embodiment of an integrated semiconductor memory comprising voltage stabilizers to generate internal voltages of the semiconductor memory.

FIG. 7 shows an embodiment of an integrated semiconductor memory chip 1000 comprising memory banks B1 . . . B4. The pad P1 to receive a supply voltage Vext and pad P2 to receive a supply voltage Vss is located in a center portion of the chip, in the so called spine area of the chip. The voltage generator 60 formed, for example, as a band-gap reference circuit is connected between pad P1 and pad P2. Pad P1 is connected to track L3 to apply the supply voltage Vext to memory bank B1. The output side of the voltage generator 60 is connected to a track L4 to apply the input voltage V1 to memory bank B1. Pad P2 to receive the input voltage Vss, for example a negative supply voltage Vss, is connected to memory bank B1 via tracks L1 and L2.

Memory bank B1 comprises a memory cell array SZF comprising memory cells SZ formed, for example, as DRAM (dynamic random access memory) cells. A control circuit CC controls read and write accesses to the memory cells. A memory cell is selected by address signals stored in an address register AR which is connected to a column decoder CD and a row decoder RD for selecting respective rows and column lines in the memory cell array. Voltage stabilizers 200a and 200c including the circuit structure shown in the embodiments of FIG. 2 or 3 are distributed over the chip area of the semiconductor memory chip 1000 to provide the control circuit CC, the column decoder CD or the row decoder RD with a constant output voltage Vout. The voltage stabilizers as well as the control circuit, the row decoder, the column decoder and the address register are illustrated in FIG. 7 as being included in memory B1. The voltage stabilizers, the control circuit, the decoders and the address register may also be arranged in the area of the chip between memory banks B1, B2, B3 and B4.

In a power-saving mode of an integrated semiconductor memory where no read and write accesses to memory cells occur, the switching frequency of the switches S1, . . . , S4 can be reduced. In the power-saving mode it is also possible to open both pairs of switches S1, S2 and S3, S4 simultaneously. In this case the reference voltage is propagated to the output node without ground level compensation. However, in the power-saving mode (power down mode), when most of the power consumers are turned off, there is no need for a ground level compensation.

The embodiment of the integrated circuits for generating an output voltage Vout having a constant level as well as the described method for operating the integrated circuits matches very well with the most popular architecture of the memory chips, where a special kind of clock signals is used for pumping high voltage with switchable capacitors.

While specific embodiments have been described in detail in the foregoing detailed description and illustrated in the accompanying drawings, those with ordinary skill in the art will appreciate that various modifications and alternatives to those details could be developed in the light of the overall teachings of the disclosure. Accordingly, the particular arrangements disclosed are meant to be illustrative only and not limiting as to the scope of the invention, which is to be given the full breadth of the appended claims and any and all equivalents thereof.

What is claimed is:

1. An integrated circuit, comprising:
a first storage component;
a voltage stabilizer circuit configured to receive an input voltage and to provide an output voltage; and
a load coupled to the output voltage of the voltage stabilizer circuit;
wherein the integrated circuit is operable in first and second operating states; and
wherein the first storage component is configured to receive the input voltage from a first node and to be coupled to a reference voltage from a second node in the first operating state, and is configured to provide the input voltage via a third node to the voltage stabilizer circuit and to be isolated from the input voltage on the first node and the reference voltage on the second node in the second operating state.

2. The integrated circuit according to claim 1, wherein:
the integrated circuit, in the first operating state, is configured to isolate the first storage component from the voltage stabilizer circuit at the third node and to couple the first storage component between the input voltage at the first node and the reference voltage at the second node; and
the integrated circuit, in the second operating state, is configured to isolate the first storage component from the input voltage at the first node and the reference voltage at the second node and couple the first storage component to the voltage stabilizer circuit via the third node.

3. The integrated circuit according to claim 1, further comprising:
a second storage component;
wherein the integrated circuit, in the first operating state, is configured to isolate the second storage component from the first storage component; and
wherein the second storage component is configured to receive the input voltage from the first storage component and to provide the input voltage to the voltage stabilizer circuit via a fourth node in the second operating state.

4. The integrated circuit according to claim 1, further comprising:
a resistive track;
wherein the load is coupled to the reference voltage via the resistive track.

5. The integrated circuit according to claim 4,
wherein the resistive track is coupled to a ground potential.

6. An integrated circuit, comprising:
a first storage component;
a voltage stabilizer circuit configured to receive an input voltage and to provide an output voltage; and
a load coupled between the output voltage of the voltage stabilizer circuit and a reference voltage;
wherein the integrated circuit, in a first operating state, is operable to couple the storage component between a first node for receiving the input voltage and a second node for receiving the reference voltage, and, in a second operating state, is operable to isolate the first storage component from the first node for receiving the input voltage and the second node for receiving the reference voltage and to couple the storage component between an input of the voltage stabilizer circuit and an output of the load.

7. The integrated circuit according to claim 6, further comprising:
a second storage component coupled between the input of the voltage stabilizer circuit and the output of the load.

8. The integrated circuit according to claim 7, wherein:
the integrated circuit, in the first operating state, isolates the second storage component from the first storage component; and
the integrated circuit, in the second operating state, couples the second storage component to the first storage component.

9. The integrated circuit according to claim 6, further comprising:
a resistive track;
wherein the load is coupled to the reference voltage via the resistive track.

10. The integrated circuit according to claim 9, further comprising:
a first switch coupled between the first storage component and the first node for receiving the input voltage;
wherein the first switch, in response to the integrated circuit being in the first operating state, is turned on, thereby coupling the first storage component to the first node for receiving the input voltage; and
wherein the first switch, in response to the integrated circuit being in the second operating state, is turned off, thereby isolating the first storage component from the first node for receiving the input voltage.

11. The integrated circuit according to claim 10, further comprising:
a second switch;
wherein the second switch, in response to the integrated circuit being in the first operating state, is turned off, thereby isolating the first storage component from the second storage component; and
wherein the second switch, in response to the integrated circuit being in the second operating state, is turned on, thereby coupling the first storage component to the second storage component.

12. An integrated circuit operable in first and second operating states, comprising:
means for providing an input voltage;
means for providing a reference voltage;
means for storing a voltage;
first means for switching, coupled between the means for providing an input voltage and the means for storing a voltage;
means for stabilizing a voltage and configured to receive the input voltage and to provide an output voltage;
second means for switching, coupled between the means for storing a voltage and the means for stabilizing a voltage;
third means for switching, coupled between the means for providing a reference voltage and the means for storing a voltage; and
a load coupled to the means for stabilizing a voltage, wherein:
the first and third means for switching, in response to the integrated circuit being in the first operating state, are turned on to couple the means for storing a voltage between the means for providing an input voltage and the means for providing a reference voltage, and the first and the third means for switching, in response to the integrated circuit being in the second operating state, are turned off to isolate the means for storing a voltage from the means for providing an input voltage and the means for providing a reference voltage; and
the second means for switching, in response to the integrated circuit being in the first operating state, is turned off to isolate the means for storing a voltage from the means for stabilizing a voltage, and the second means for switching, in response to the integrated circuit being in the second operating state, is turned on to connect the means for storing a voltage to the means for stabilizing a voltage.

13. The integrated circuit according to claim 12, further comprising:
second means for storing a voltage coupled between the second means for switching and the means for stabilizing a voltage.

14. The integrated circuit according to claim 13, further comprising:
a resistive track coupled to the means for providing a reference voltage;
wherein an input of the load is coupled to the means for stabilizing a voltage and an output of the load is coupled to the reference potential via the resistive track.

15. The integrated circuit according to claim 14, wherein:
the second means for switching, in response to the integrated circuit being in the first operating state, is turned off to further isolate the means for storing a voltage from the second means for storing a voltage, and the second means for switching, in response to the integrated circuit being in the second operating state, is turned on to further connect the first means for storing a voltage to the second means for storing a voltage.

16. An integrated circuit, comprising
a voltage stabilizer circuit with an input to receive an input voltage and an output to provide an output voltage;
a first storage component configured to store an input voltage, the first storage component being switchably coupled to the voltage stabilizer circuit;
a resistive track coupled to a ground potential;
a load connected between the output of the voltage stabilizer circuit and the ground potential via the resistive track;
a first switch operable in first and second operating modes, wherein the first switch, in the first operating mode, couples the first storage component to the input voltage, and in the second operating mode, isolates the first storage component from the input voltage; and
a second switch operable in first and second operating modes, wherein the second switch, in the first operating mode, couples the first storage component to the ground potential, and in the second operating mode, isolates the first storage component from the ground potential.

17. The integrated circuit according to claim 16, wherein the first storage component is switchably coupled between the input voltage and the ground potential.

18. The integrated circuit according to claim 16, further comprising:
a second storage component configured to store the input voltage, the second storage component being switchably connected to the first storage component.

19. The integrated circuit according to claim 18, further comprising:
a third switch operable in first and a second operating modes, wherein the third switch, in the first operating mode, couples the second storage component to the first storage component, and in the second operating mode, isolates the second storage component from the first storage component; and
a fourth switch operable in first and a second operating modes, wherein the fourth switch, in the first operating mode, couples the second storage component to the first storage component, and in the second operating mode, isolates the second storage component from the first storage component.

20. The integrated circuit according to claim 18, further comprising:
a second track connected between the ground potential and the second switch.

21. The integrated circuit according to claim 20, further comprising:
a voltage generator configured to generate the input voltage, the voltage generator being connected between a first voltage and a second voltage;
a third track coupling the voltage generator to the voltage stabilizer circuit; and
a fourth track coupling the voltage generator to the storage component.

22. The integrated circuit according to claim 21, further comprising:
a memory cell array comprising a plurality of memory cells arranged between word lines and bit lines; and
a decoder circuit configured to select one of the word lines and one of the bit lines;
wherein the load comprises the memory cell arrays and the decoder circuit.

23. The integrated circuit according to claim 18, wherein the first and second storage components each comprise a capacitor.

24. The integrated circuit according to claim 16, wherein the voltage stabilizer comprises an operational amplifier based follower.

25. A method for operating an integrated circuit, the method comprising:
isolating a first storage component of the integrated circuit from a voltage stabilizer circuit of the integrated circuit, the first storage component being switchably coupled to the voltage stabilizer circuit;
coupling the first storage component between an input voltage and a ground potential, the first storage component being switchably coupled to a first terminal of the integrated circuit configured to receive the input voltage and to a second terminal of the integrated circuit configured to receive the ground potential;
isolating the first storage component from the input voltage and from the ground potential; and
coupling the first storage component to the voltage stabilizer circuit, wherein the voltage stabilizer circuit is configured to receive the input voltage and to provide an output voltage;
wherein a load of the integrated circuit is connected between an output of the voltage stabilizer circuit and the ground potential via a resistive track of the integrated circuit.

26. The method according to claim 25, further comprising:
isolating a second storage component of the integrated circuit from the first storage component prior to coupling the first storage component between the input voltage and the ground potential, the second storage component being switchably coupled to the first storage component; and
coupling the second storage component to the first storage component subsequent to isolating the first storage component from the input voltage and from the ground potential.

27. The method according to claim 26, further comprising:
turning off a first switch of the integrated circuit to isolate the first storage component form the second storage component;
turning on a second switch of the integrated circuit to couple the first storage component to the first terminal for receiving the input voltage;
turning off the second switch to isolate the first storage component from the first terminal for receiving the input voltage; and
turning on the first switch to couple the second storage component to the first storage component.

28. The method according to claim 27, further comprising:
increasing a switching frequency for turning on and off the switches in a normal operating mode of an integrated semiconductor memory of the integrated circuit; and
decreasing the switching frequency for turning on and off the switches in a power saving mode of the integrated semiconductor memory;
wherein the integrated semiconductor memory, in the normal operating mode, read and write accesses to memory cells of the integrated semiconductor memory are carried out, and in the power-saving mode, read and write accesses to the memory cells of the integrated semiconductor memory are interrupted.

29. The method according to claim 28, wherein the integrated semiconductor memory, in the power-saving mode, the first and second switches are simultaneously turned on and simultaneously turned off.

* * * * *